United States Patent [19]
Qiao et al.

[11] Patent Number: 5,976,900
[45] Date of Patent: Nov. 2, 1999

[54] METHOD OF REDUCING IMPURITY CONTAMINATION IN SEMICONDUCTOR PROCESS CHAMBERS

[75] Inventors: Jianmin Qiao; Guofu Jeff Feng, both of Fremont, Calif.

[73] Assignee: Cypress Semiconductor Corp., San Jose, Calif.

[21] Appl. No.: 08/986,371

[22] Filed: Dec. 8, 1997

[51] Int. Cl.$^6$ ............................ G01R 31/26; H01L 21/66
[52] U.S. Cl. ................................................ 438/14; 438/905
[58] Field of Search ........................................ 438/905, 14

[56] References Cited

U.S. PATENT DOCUMENTS

| | | |
|---|---|---|
| 5,166,101 | 11/1992 | Lee et al. . |
| 5,278,103 | 1/1994 | Mallon et al. . |
| 5,286,681 | 2/1994 | Maeda et al. . |
| 5,314,845 | 5/1994 | Lee et al. . |
| 5,336,640 | 8/1994 | Sato . |
| 5,354,387 | 10/1994 | Lee et al. . |
| 5,362,526 | 11/1994 | Wang et al. . |
| 5,366,585 | 11/1994 | Robertson et al. . |
| 5,376,591 | 12/1994 | Maeda et al. . |
| 5,382,550 | 1/1995 | Iyer . |
| 5,571,571 | 11/1996 | Musada et al. . |
| 5,614,055 | 3/1997 | Fairbairn et al. . |
| 5,652,187 | 7/1997 | Kim et al. . |
| 5,656,556 | 8/1997 | Yang . |
| 5,788,799 | 8/1998 | Steger et al. . |

OTHER PUBLICATIONS

Wolf, Stanley, "Silicon Processing For The VLSI Era", vol. 1, Lattice Press Sunset Beach CA, pp. 188–195.
Wolf, Stanley, "Silicon Processing For The VLSI Era", vol. 2, Lattice Press Sunset Beach CA, pp. 194–199; 273–276.

*Primary Examiner*—John F. Niebling
*Attorney, Agent, or Firm*—Young Law Firm, P.C.

[57] ABSTRACT

A method of reducing impurities in films to be deposited within a chemical vapor deposition (CVD) device includes steps of cleaning the process chamber of the CVD device, and depositing, prior to wafer processing, a gettering layer of, for example, phosphorous containing glass on interior surfaces of the process chamber. The gettering layer getters mobile alkali ions and substantially reduces or prevents outdiffusion of alkali ions and other impurities. The phosphorous containing glass may also be doped with boron. A blocking layer, such as undoped silicate glass, silicon nitride, silicon oxynitride or the like may be deposited on the gettering layer to trap impurities and to prevent phosphorous contamination in a applications sensitive to such contamination. Alternatively, silicon nitride or silicon oxynitride may be deposited on interior surfaces of the process chamber without a gettering layer, to thereby substantially prevent outdiffusion of underlying moisture and impurities during subsequent deposition of films onto the wafers to be processed.

20 Claims, 2 Drawing Sheets

METHOD OF REDUCING IMPURITY CONTAMINATION IN SEMICONDUCTOR PROCESS CHAMBERS

BACKGROUND OF THE INVENTION

1. Field of the Invention

The invention pertains to the field of semiconductor process chambers, and to methods of reducing contaminants in such chambers and in wafers processed in such chambers.

2. Description of the Related Art

As semiconductor device densities increase and line widths decrease, the control of impurities and contaminants is increasingly important. The presence of impurities during the fabrication process can cause decreased yields, non-uniform device performance characteristics and can increase leakage currents, among other ill effects.

It is thus crucial to insure the purity of semiconductor layers during their formation. One method of creating layers on semiconductor wafers is by Chemical Vapor Deposition, or CVD. CVD utilizes a controlled chemical reaction in a gas or in the vapor phase to deposit thin films on a solid surface, such as a semiconductor substrate. Insuring the purity of deposited semiconductor layers during CVD processes is becoming a major concern as process pressures and deposition temperatures decrease and as the reactant gases are energized to increasingly higher levels.

Much attention has been given of late to low temperature CVD processes. Indeed, a number of polymer and low melting point metal films require a low processing temperature to avoid defects such as dislocations, interstitial species, stacking faults and the like. For example, final passivating films (such as silicon nitride) over aluminum metallization must be formed at temperatures less than 400° C. The need for ever lower temperatures has been instrumental in fueling the development of Plasma Enhanced Chemical Vapor Deposition (PECVD) devices, in which the creation of a plasma in a gas mixture produces chemically reactive species at low temperatures. In PECVD devices, RF frequency glow discharges creates high-energy electrons that dissociate and ionize gaseous molecules, to generate chemically reactive radicals and ions. Kinetic energies for the electrons in PECVD chambers generally range in the $10^2$ to $10^4$ eV range.

Plasma-Enhanced CVD, however, increase contamination problems, as the chamber walls are subject to high-energy ion bombardment. To prevent the deposited films from being contaminated with such impurities, a number of contaminant decreasing measures have been implemented. Examples of such measures include careful cleaning of the interior of the process chamber, careful handling of materials, and strict control of the purity of the chamber components. Another contaminant decreasing measure that has been adopted is a process that is alternatively referred to as chamber seasoning, conditioning or pre-coating. These terms refer to coating some portion of the interior surfaces of the process chamber with undoped silicate glass, or USG. As shown in FIG. 1, a typical wafer processing cycle may include a reactor dry clean step, followed by a USG pre-coat step and a wafer deposition step. The pre-coat step shown in FIG. 1 coats interior surfaces of the processing chamber with a USG layer that is believed to act as a barrier to underlying impurities, preventing the impurities from out-diffusing from the interior surfaces of the chamber. After pre-coating, as shown in FIG. 1, the wafers are processed and the requisite films deposited. After a predetermined interval or after the processing of a predetermined number of wafers, the process is repeated, whereupon the reactor is once again dry cleaned. Periodic Maintenance (PM) of the process chamber is also generally required. Typically, such Periodic Maintenance includes a wet cleaning step using, for example, isopropyl alcohol or de-ionized water. Other cleaning steps may include the introduction of a fluorine containing gas into the process chamber, such as $NF_3$. Nevertheless, microcontamination levels from particles and ion contaminants, despite these precautions, have typically remained in the $1 \times 10^{10}$ ions/cm$^2$ range, even when a USG pre-coat step is carried out after the in-situ dry cleaning step.

Newer techniques for chemical vapor deposition have been developed. For example, High Density Plasma Chemical Vapor Deposition, or HDPCVD, was developed to fulfill the requirements of shrinking chip size. HDP-CVD has the ability to deposit oxides into small gaps while avoiding the formation of voids by combining low pressures, an inductive coupled plasma CVD and a plasma sputtering process. For this reason, HDP-CVD is also called a simultaneous deposition and etch technology. In HDP-CVD, a source plasma that is generated by inductive coupling RF power produces ions and contributes to deposition, while a bias RF power enhances ion sputtering at the surface of the wafers and also at the processing chamber surfaces. The high density and low pressure inherent in HDP-CVD devices, however, increases sputtering on the process chamber interior surfaces. It has been found that conventional techniques for controlling the contaminant levels have proven to be ineffective in reducing contaminants to acceptable levels in high-density plasma environments. Specifically, undoped silicate glass, while decreasing contaminant levels somewhat, has proven ineffective in bringing contaminant levels in HDPCVD reactors down to PECVD levels. Moreover, even extreme care in handling process chamber components and the use of very high purity reactor parts in combination with a long USG pre-coating step has not reduced contaminants to acceptable levels, particularly for applications that are highly sensitive to contaminants. Indeed, certain processes such as Shallow Trench Isolation or STI, while benefiting from deposition in an HDPCVD environment, are extremely sensitive to impurities that degrade their performance.

What is needed, therefore, is a method of further reducing impurity levels in thin films to be deposited in chemical vapor deposition devices. Indeed, there has been a long felt need for a method to reduce contaminant levels in high plasma density, low pressure and temperature chemical vapor deposition devices to levels that are acceptable to the most demanding applications.

SUMMARY OF THE INVENTION

It is, therefore, an object of the present invention to provide a method of reducing impurity levels in films to be deposited in chemical vapor deposition devices.

It is a further object of the present invention to provide a method for reducing contaminant levels in high plasma density, low pressure and temperature chemical vapor deposition devices.

In accordance with the above objects and those that will be mentioned and will become apparent below, the method of reducing contamination to films to be deposited within a process chamber of a chemical vapor deposition device, comprises the steps of:

cleaning the process chamber; and depositing, prior to wafer processing, a layer of phosphorous containing glass on interior surfaces of the process chamber. In this manner, the phosphorous containing glass acts as a getter to highly mobile and performance decreasing alkali ion impurities, such as $Na^+$ and $K^+$.

The cleaning step may comprise a dry cleaning step, a wet cleaning step, or both. The phosphorous containing glass may comprise a phosphosilicate glass. The phosphorous containing glass may further comprises boron. A concentration of phosphorous in the phosphorous containing glass may be selected within the range of about 1 wt % to about 8 wt %. The layer of phosphorous containing glass may be deposited to a thickness selected within the range of about 100 angstroms to about 5 micrometers. A step of depositing a layer of undoped silicate glass over the phosphorous containing glass may be also carried out. A step of depositing a first layer undoped silicate glass may also be carried out, before the phosphorous containing glass depositing step. A second layer of undoped silicate glass may be deposited over the layer of phosphorous containing glass. The phosphorous containing glass depositing step may comprise reacting $PH_3$, $SiH_4$ and $O_2$, at a pressure of from about 1 milliTorr to about 10 Torr. The interior surfaces of the process chamber may comprise one or more members of the group consisting of ceramic surfaces, gaskets, sources of mobile ions and sources of contaminants.

According to another embodiment of the present invention, a method of reducing contamination within a process chamber of a chemical vapor deposition device, comprises the steps of:

cleaning the process chamber; and pre-coating the process chamber with at least one gettering layer having an alkali ion gettering property, prior to wafer processing.

The gettering layer may include a phosphorous containing glass, and the phosphorous containing glass may comprise a phosphosilicate glass. The phosphorous containing glass may comprises boron. The pre-coating step further may include a step of depositing one or more blocking layers selected from the group consisting of undoped silicate glass, silicon nitride and silicon oxynitride.

In another embodiment, the present invention is a method of reducing contamination to films to be deposited within a process chamber of a chemical vapor deposition device, and comprises the steps of:

cleaning the process chamber; and depositing, prior to wafer processing, at least a layer of a silicon nitride on interior surfaces of the process chamber.

A step of depositing a layer of a phosphorous containing glass and/or a layer of undoped silicate glass may be carried out. Furthermore, a step of depositing a layer of silicon oxynitride may also be carried out.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

To further reduce the impurity levels in chemical vapor deposition devices required novel insights into both the nature and the possible sources of the problem. Indeed, the present invention is partly predicated upon the identification of the nature of the contaminants in HDPCVD and like reactors, as well as their source.

High-density plasma CVD devices create very energetic ions that bombard the chamber interior surface with great kinetic energy. Impurities within the interior surfaces of the reactor have been found to include, for example, $Na^+$ and $K^+$ ions, which are highly mobile alkali ions. It is believed that a portion of these mobile alkali ions originate from the chamber walls themselves. Although often formed of aluminum, CVD process chambers can include a significant amount of impurities, which may become a factor under the influence of high-density plasma and low operating pressures. Moreover, it is believed that the ceramic reactor parts also contain significant amounts of mobile alkali ions such as $Na^+$ and $K^+$ ions. Yet another source of mobile alkali ions that has been identified is the gaskets joining various parts of the CVD reactor, and the coatings thereof Under the combined influence of the high-density plasma and low operating pressures, the tendency for such contaminants to outdiffuse is increased.

Even if the interior surfaces of the reactor chamber are pre-coated with undoped silicate glass, it has been found that mobile alkali ions, such as sodium, are able to diffuse through the USG pre-coat and contaminate the films formed on the wafer. The effect of such contamination may be increased electrical conductivity of the oxide layers on the semiconductor device. Indeed, when oxide glasses are placed under the influence of an electrical field, ion transport causes increased electrical conductivity. When forming oxide insulating layers and dielectrics, increased electrical conductivity is an undesirable phenomenon, leading to decreased functionality and performance.

Figure 1:
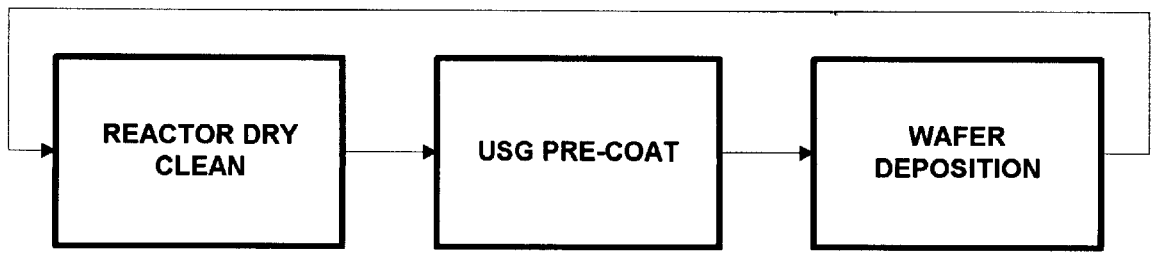
FIG. 1 shows steps a sequence of steps for conditioning a process chamber of a chemical vapor deposition device.
Figure 2:
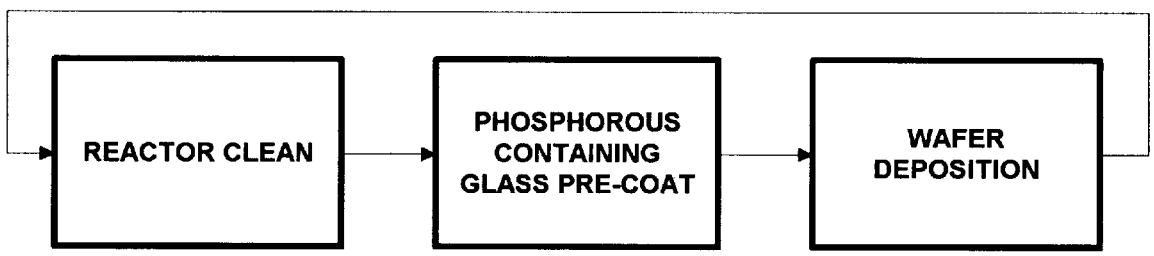
FIG. 2 shows one embodiment of the method of reducing impurities in a process chamber of a chemical vapor deposition device, according to the present invention.

According to one embodiment of the present invention, the outdiffusion of mobile ions from these surfaces is substantially reduced or altogether prevented by a novel pre-coat layer. This pre-coat layer coats interior surfaces of the process chamber with phosphorous containing glass. Such a layer acts as a getter to the mobile ions. Thus, by pre-coating at least a portion of the interior surfaces of the process chamber with phosphorous containing glass, mobile alkali ions and other metallic impurities may be prevented from adversely affecting the films to be deposited by gettering the alkali ions and trapping the resultant molecules within the pre-coat layer. As shown in FIG. 2, according to one embodiment of the present invention, the process chamber is first cleaned. This cleaning may be a wet and/or a dry clean. Then, a phosphorous containing glass is pre-coated on interior surfaces of the process chamber. According to the present invention, substantially all interior surfaces may be pre-coated or only parts that are known to contain mobile contaminants. Such parts include gaskets, ceramic parts, coated parts, quartz parts and the like. Thereafter, wafer deposition may be carried out. In this manner, the contamination level of the deposited films is substantially reduced, as compared with films deposited in reactors pre-coated only with USG, or without a pre-coat layer.

Figure 3:
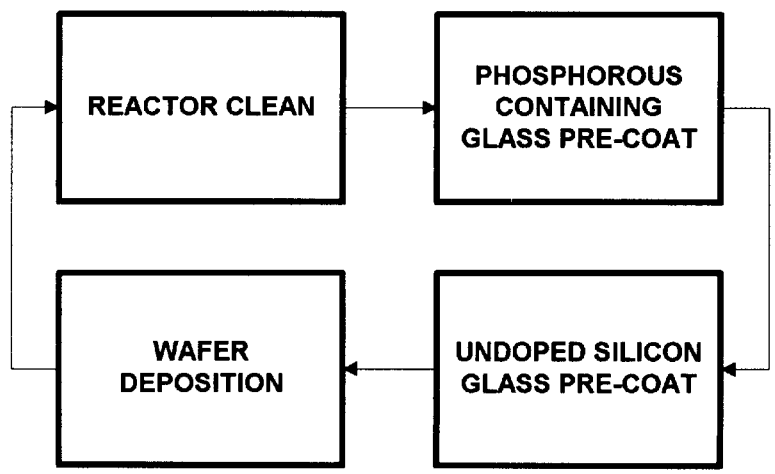
FIG. 3 shows another embodiment of the method of reducing impurities in a process chamber of a chemical vapor deposition device, according to the present invention.

One example of phosphorous containing glass is PSG, or phosphosilicate glass. PSG is utilized as a process chamber pre-coat, according to the present invention, when there is no concern as to phosphorous contamination in the films to be deposited. An Inter Metal Dielectric (IMD) layer is one example of a material that is relatively insensitive to phosphorous contamination and that may benefit from a process chamber PSG pre-coat before the IMD deposition stage. When phosphorous contamination may be problematic to the films to be deposited, such as when Shallow Trench Isolation (STI) structures are to be formed, then the phosphorous containing glass or the PSG layer may be covered with an undoped silicate glass or USG layer, as shown in FIG. 3. In this manner, the phosphorous containing glass, or the PSG layer in particular, getters the highly mobile sodium and potassium ions and other metallic impurities, and acts as a diffusion barrier to moisture and other contaminants. The overlying USG film, while not substantially acting as a getter, nevertheless traps other contaminants and protects the process chamber from the phosphorous dopant in the film being deposited on the wafer. In effect, the USG is believed to act as a capping layer to the underlying PSG or phosphorous containing glass to prevent phosphorous migration and possible subsequent sputtering of phosphorous onto the layers to be deposited.

To pre-coat a PSG layer onto interior surfaces of the process chamber of the chemical vapor deposition device, a source of phosphorous such as phosphine ($PH_3$) is introduced into a silane ($SiH_4$) oxygen ($O_2$) and argon (Ar) atmosphere. As is known in the art, other sources of phosphorous, silicon and oxygen may be substituted for phosphine, silane and oxygen. The resulting phosphosilicate glass may have a phosphorous concentration within a range of from about 1 wt % to about 8 wt %. Care should be taken to limit the phosphorous concentration to limit the formation of phosphoric acid and possible corrosion of aluminum chamber walls or other interior parts. Preferably, the phosphorous concentration in the PSG layer may be about 5 wt %. Permissible ranges for the respective gas flows range from about 10 to about 200 sccm for the $PH_3$, about 10 to about 500 sccm for the $SiH_4$ and about 10 to about 1000 sccm for the $O_2$. Preferably, the flow rates may be selected within the ranges of about 15 to about 60 sccm for $PH_3$, about 50 to about 200 sccm for $SiH_4$, and about 150 to about 600 sccm for $O_2$. For example, the gas flows may be as follows: about 30, about 100 and about 300 sccm for the $PH_3$, $SiH_4$ and $O_2$ gases, respectively. Inert gas such as Ar may be used as a way of controlling PSG film density. If Ar gas is used, the permissible flow ranges from about 10 to about 1,000 sccm.

To deposit a layer of PSG pre-coat on interior surfaces on the process chamber, the ambient pressure may range from about 1 mT to about 10 T and preferably about 2.5 to about 10 mT, while the RF power applied may be selected within a range of about 100 to about 5,000 W, and preferably within a range of about 1,500 W to about 4,000 W. For example, the pressure within the process chamber may be about 5 mT, while the RF bias power may be about 3,500 W. The PSG layer may be deposited on interior surfaces of the reactor chamber to a thickness ranging from about 100 Å to about 5 $\mu$m. For example, the PSG layer may be deposited to a thickness of about 1 $\mu$m. The deposition rate may be selected within a range of about 100 Å/min to about 5 $\mu$m/min and preferably about 1 $\mu$m/min. Deposition times may vary between about 5 sec. to about 5 min, and will preferably be within a range of about 10 sec. to about 1 min. The temperature of the process chamber during the deposition may be within the range conventionally used in HDP-CVD reactors.

Alternatively, the phosphorous containing glass may be doped with boron (from a source such as $B_2H_6$) to form borophosphosilicate glass, or BPSG. BPSG exhibits a similar alkali ion gettering function as PSG. A BPSG layer, therefore, may be formed on at least some of the interior surfaces of a chemical vapor deposition process chamber and effectively suppress or limit contamination by highly mobile alkali ions such as $Na^+$ and $K^+$. BPSG is a ternary compound, formed of $B_2O_3$, $P_2O_5$ and $SiO_2$. As with PSG, in processes that are sensitive to phosphorous, a layer of USG may be formed overlying the BPSG layer, to prevent or limit the phosphorous outdiffusion.

Figure 4:
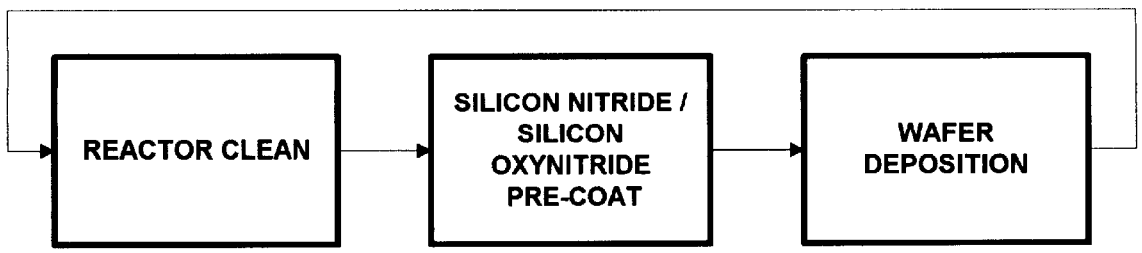
FIG. 4 shows a further embodiment of the method of reducing impurities in a process chamber of a chemical vapor deposition device, according to the present invention.

Alternatively still, instead of a phosphorous containing glass, silicon nitride ($Si_3N_4$) may be deposited on at least some of the interior surfaces of a process chamber of a chemical vapor deposition device, as shown in FIG. 4. Silicon nitride is believed to be a highly effective barrier to moisture, and other impurities. Although not generally used as a getter, silicon nitride operates as an excellent pre-coat for chemical vapor deposition process chambers for many of the same reasons that silicon nitride is used as a passivation layer: it is highly conformal, relatively pin-hole free, a good moisture barrier and blocks outdiffusion of small mobile ions. Therefore, according to the present invention, silicon nitride may be deposited on at least some of the interior surfaces of process chambers of chemical vapor deposition devices, after the reactor is cleaned and prior to wafer processing, as shown in FIG. 4. In this manner, by pre-coating the chamber walls of the process chamber with a layer of silicon nitride, underlying impurities including mobile ion species may be prevented from contaminating the wafer or wafers to be subsequently processed. These impurities may originate from the metallic walls of the process chamber, ceramic parts, gaskets, coatings, nitrogen trifluoride ($NF_3$) residue from previous chamber etch cleanings, and like sources, including contaminants originating from human handling.

According to the present invention, the silicon nitride pre-coat may be formed within the process chamber using reactant sources of nitrogen and silicon, such as gases containing Si and N, such as $N_2$ and $SiH_4$. Acceptable gas flow ranges for $N_2$ may be from about 10 to about 2000 sccm, while acceptable ranges for $SiH_4$ may be from about 10 to about 500 sccm. Preferably, the reactant gas flows may range between about 250 to about 1000 sccm for $N_2$ and between about 50 to about 200 sccm for $SiH_4$, respectively. For example, gas flows for $N_2$ and $SiH_4$ may be about 500 and about 100 sccm, respectively. The ranges for thickness, pressure, deposition rate, temperature, RF powers and deposition time detailed with respect to phosphorous containing glass are applicable to silicon nitride and the description of these ranges is incorporated herewith as if repeated in full.

It is also envisaged, according to the present invention, to apply a silicon nitride layer to interior surfaces of a process chamber in combination with a layer of USG, phosphorous containing silicon glass, PSG, boron doped phosphorous containing glass or BPSG, depending upon the application at hand. All combinations of such process chamber pre-coat layers are, therefore, within the scope of the present invention. Accordingly, at least some interior surfaces of a process chamber, according to the present invention, may be pre-coated with one or more of the following materials: USG, phosphorous containing silicon glass, PSG, boron doped phosphorous containing glass, BPSG, silicon nitride.

Alternatively still, silicon oxynitrides, having the general composition $SiO_xN_y(H_z)$ may be utilized as a process chamber pre-coat material alone, or in combination with undoped silicate glass, phosphorous doped silicon glass, boron doped phosphorous containing glass or silicon nitride.

The present invention is believed to be applicable to and effective in most any type of chemical vapor deposition device. The present invention is particularly effective in reactors wherein a high-density plasma is inductively coupled and capacitively biased at RF powers, and at pressures in the mTorr range. For example, the present invention is particularly effective at blocking and/or gettering underlying impurities in High Density Plasma Chemical Vapor Deposition (HDPCVD) devices. This is believed to be the case because of the high-energy bombardment of the interior surfaces caused by the high-density plasma. Indeed, the denser the plasma, the more reactive highly mobile ions such as $Na^+$ and $K^+$ become, especially in a low pressure ambient. Indeed, at low pressures, the mean free path of the high-energy ions may be increased, bringing about increased contamination.

As the bias power introduces capacitive coupling, the high-energy ions are given a direction component not only towards the process chamber pedestal, but also towards the chamber walls. This is believed to effectively etch the chamber walls and other interior surfaces. Therefore, the effectiveness of the pre-coat layers detailed above will be partly predicated upon their thickness and density.

The present invention is also believed to be highly effective in preventing process chamber contamination before the RF bias power is applied, but after the plasma is generated. Indeed, before wafer deposition steps occur under the influence of the high RF bias power, the process chamber may contain, for example, an argon plasma. This argon plasma etches the interior surfaces of the process chamber, albeit at a much lower rate than after the RF bias power is applied. During this plasma-induced etching, the process chamber may pick up underlying impurities, such as highly mobile alkali ions, unless such are gettered by an appropriate material exhibiting gettering characteristics. USG alone cannot prevent outdiffusion of, for example, $Na^+$ and $K^+$. This outdiffusion may be substantially reduced, or eliminated, according to the present invention, by pre-coating interior surfaces of the process chamber with getters such as phosphorous containing glass, boron doped phosphorous containing glass, or impurity blocking materials such as silicon nitride, silicon oxynitride or other materials having similar blocking properties.

The present invention also presents substantial costs savings over the use of USG alone as a pre-coat material. Indeed, to increase the blocking ability of USG alone, the only solution is to increase the thickness of the USG layer, by increasing the deposition rate and/or increasing the deposition time. This reduces processing chamber throughput, meaning that fewer wafers can be processed per unit time. According to the present invention, more effective contamination blocking and/or gettering pre-coat layers are deposited, thus reducing pre-coat layer or layers deposition time, and increasing the CVD device throughput.

Figure 5:
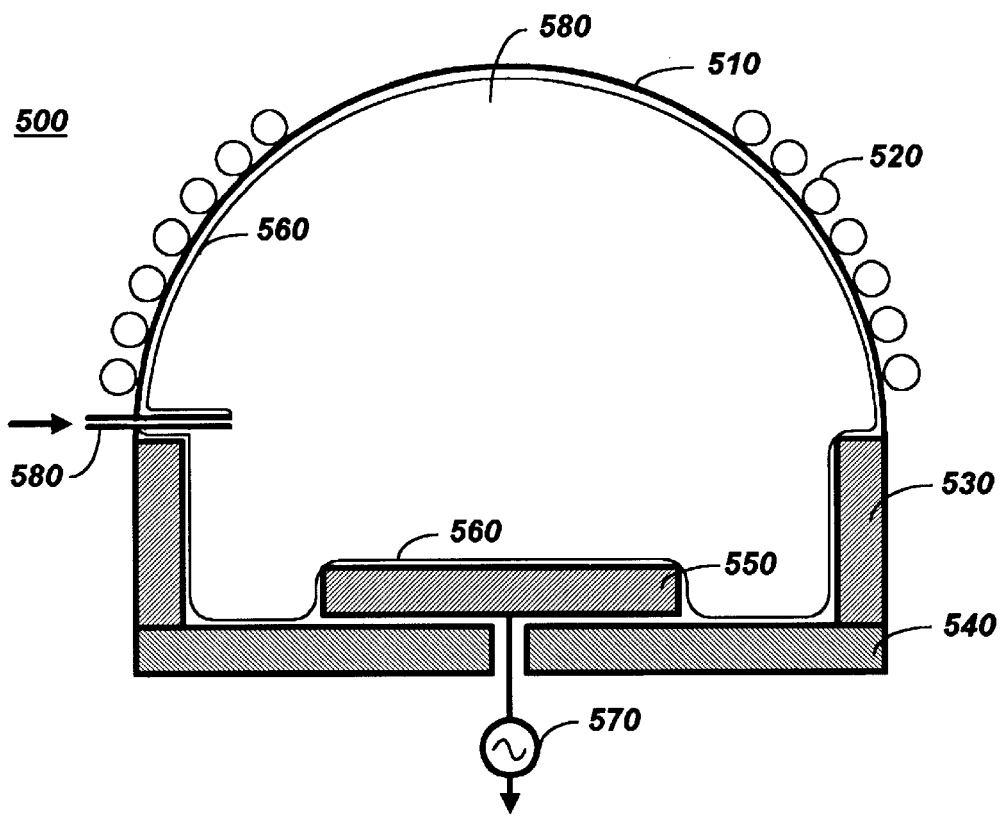
FIG. 5 schematically illustrates a process chamber of a chemical vapor deposition device, the interior surfaces of which are covered by at least one contaminant blocking and/or gettering layer, according to the present invention.

FIG. 5 schematically illustrates an example of a CVD device 500, the interior of which has been pre-coated according to the present invention. The CVD device shown in FIG. 5 includes a chamber sidewall 530, a chamber base 540, a chamber ceiling 510, an induction coil 520, a gas inlet 580 to introduce the plasma and reactant gases, an RF bias source 570 and an RF electrode. The wafer to be processed (not shown) is disposed on the RF electrode 550. FIG. 5, as the skilled artisan will recognize does not show all of the parts of a functioning CVD device, as the figure is merely intended to illustrate one possible implementation of the present inventive methods. As shown in FIG. 5, at least one pre-coat layer 560 is deposited on interior surfaces of the process chamber 580. As disclosed above, this pre-coat layer 560 is deposited after the process chamber is cleaned. This cleaning may be a fluorine etch, a wet cleaning using isopropyl alcohol, a dry clean, or most any other type of cleaning step. The pre-coat layer (or layers) 560 is then deposited, thereby gettering, trapping and/or blocking impurities to prevent them from contaminating the films to be deposited in the wafer or wafers to be processed. For example, should the chamber ceiling 510 be formed of impurity-containing quartz, the pre-coat layer 560 deposited thereon may protect the wafers to be processed from unwanted outdiffusions from the quartz chamber ceiling 510. Films of increased purity may be formed by such a pre-coat step or steps, and greater throughput, consistency and quality may be achieved than was previously possible. Although the present invention finds great utility in HDPCVD reactors, it is by no means limited thereto. Moreover, the present invention is readily applicable to plasma-enhanced CVD geometries other than that sketched in FIG. 5. Examples of such include single wafer PECVD reactors and multi-station PECVD reactors and the like. In fact, the present invention is readily applicable to any semiconductor-processing environment in which gettering and trapping contaminants is essential or desired.

While the foregoing detailed description has described preferred embodiments of the present invention, it is to be understood that the above description is illustrative only and not limiting of the disclosed invention. For example, other materials having gettering properties may be substituted for phosphorous containing glass. Further modifications will occur to those of skill in this art, and all such modifications are deemed to fall within the scope of the present invention. Thus, the present invention is to be limited only by the claims as set forth below.

what is claimed is:

1. A method of reducing contamination to films to be deposited within a process chamber of a chemical vapor deposition device, comprising the steps of:
    cleaning the process chamber; and
    depositing, prior to wafer processing, a layer of phosphorous containing glass on interior surfaces of the process chamber.

2. A method of reducing contamination according to claim 1, wherein the cleaning step comprises a dry cleaning step.

3. A method of reducing contamination according to claim 1, wherein the cleaning step comprises a wet cleaning step.

4. A method of reducing contamination according to claim 1, wherein the phosphorous containing glass comprises a phosphosilicate glass.

5. A method of reducing contamination according to claim 1, wherein the phosphorous containing glass further comprises boron.

6. A method of reducing contamination according to claim 1, wherein a concentration of phosphorous in the phosphorous containing glass is selected within a range of about 1 wt % to about 8 wt %.

7. A method of reducing contamination according to claim 1, wherein the layer of phosphorous containing glass is deposited to a thickness selected within a range of about 100 angstroms to about 5 micrometers.

8. A method of reducing contamination according to claim 1, further including a step of depositing a layer of undoped silicate glass over the phosphorous containing glass.

9. A method of reducing contamination according to claim 1 further comprising a step of depositing a first layer undoped silicate glass before carrying out the phosphorous containing glass depositing step.

10. A method of reducing contamination according to claim 9, further comprising a step of depositing a second layer of undoped silicate glass over the layer of phosphorous containing glass.

11. A method of reducing contamination according to claim 1, wherein the depositing step comprises reacting $PH_3$, $SiH_4$ and $O_2$, at a pressure of from about 1 milliTorr to about 10 Torr.

12. A method of reducing contamination according to claim 1, wherein the interior surfaces of the process chamber comprise at least one member of the group consisting of ceramic surfaces, gaskets, sources of mobile ions and sources of contaminants.

13. A method of reducing contamination within a process chamber of a chemical vapor deposition device, comprising the steps of:

cleaning the process chamber; and pre-coating the process chamber with at least one gettering layer having an alkali ion gettering property, prior to wafer processing.

14. A method of reducing contamination according to claim 13, wherein the gettering layer includes a phosphorous containing glass.

15. A method of reducing contamination according to claim 14, wherein the phosphorous containing glass comprises a phosphosilicate glass.

16. A method of reducing contamination according to claim 14, wherein the phosphorous containing glass comprises boron.

17. A method of reducing contamination according to claim 13, wherein the pre-coating step further includes a step of depositing at least one blocking layer selected from the group consisting of undoped silicate glass, silicon nitride and silicon oxynitride.

18. A method of reducing contamination to films to be deposited within a process chamber of a chemical vapor deposition device, comprising the steps of:

cleaning the process chamber; and depositing, prior to wafer processing, at least a layer of a silicon nitride on interior surfaces of the process chamber.

19. A method of reducing contamination according to claim 18, further comprising the step of depositing at least one of a layer of a phosphorous containing glass and a layer of undoped silicate glass.

20. A method of reducing contamination according to claim 18, further comprising the step of depositing a layer of silicon oxynitride.

* * * * *